United States Patent
Yun et al.

(10) Patent No.: US 6,917,472 B1
(45) Date of Patent: Jul. 12, 2005

(54) ACHROMATIC FRESNEL OPTICS FOR ULTRAVIOLET AND X-RAY RADIATION

(75) Inventors: Wenbing Yun, Walnut Creek, CA (US); Yuxin Wang, Arlington Heights, IL (US)

(73) Assignee: Xradia, Inc., Concord, CA (US)

( * ) Notice: Subject to any disclaimer, the term of this patent is extended or adjusted under 35 U.S.C. 154(b) by 228 days.

(21) Appl. No.: 10/134,026

(22) Filed: Apr. 25, 2002

Related U.S. Application Data

(60) Provisional application No. 60/337,752, filed on Nov. 9, 2001, and provisional application No. 60/338,362, filed on Nov. 9, 2001.

(51) Int. Cl.$^7$ ............................................. G02B 27/44
(52) U.S. Cl. .................. 359/565; 359/566; 359/576; 359/355; 359/361
(58) Field of Search ................................ 359/565, 618, 359/566, 571, 576, 350, 355, 361

(56) References Cited

U.S. PATENT DOCUMENTS

| | | | |
|---|---|---|---|
| 5,161,057 A | * 11/1992 | Johnson | ........................ 359/566 |
| 5,161,059 A | 11/1992 | Swanson et al. | |
| 5,349,471 A | 9/1994 | Morris et al. | |
| 5,453,880 A | 9/1995 | Vanderwerf | |
| 5,559,338 A | 9/1996 | Elliott et al. | |
| 5,926,318 A | * 7/1999 | Hebert | ........................ 359/618 |
| 5,946,281 A | 8/1999 | Ito et al. | |
| RE36,352 | 10/1999 | Swanson et al. | |
| 6,285,737 B1 | 9/2001 | Sweatt et al. | |
| 6,483,638 | 11/2002 | Shafer et al. | |
| 2002/0005938 | 1/2002 | Omura | |

FOREIGN PATENT DOCUMENTS

| | | | |
|---|---|---|---|
| EP | 1 006 400 A2 | 6/2000 | |
| EP | 1 006 400 A3 | 5/2003 | |

* cited by examiner

*Primary Examiner*—Fayez G. Assaf
(74) *Attorney, Agent, or Firm*—John P. O'Banion

(57) ABSTRACT

An achromatic Fresnel optic that combines a Fresnel zone plate and a refractive Fresnel lens. The zone plate provides high resolution for imaging and focusing, while the refractive lens takes advantage of the refraction index change properties of appropriate elements near absorption edges to recombine the electromagnetic radiation of different energies dispersed by the zone plate. This compound lens effectively solves the high chromatic aberration problem of zone plates. The AFO has a wide range of potential applications in lithography, microimaging with various contrast mechanisms and measurement techniques.

44 Claims, 13 Drawing Sheets

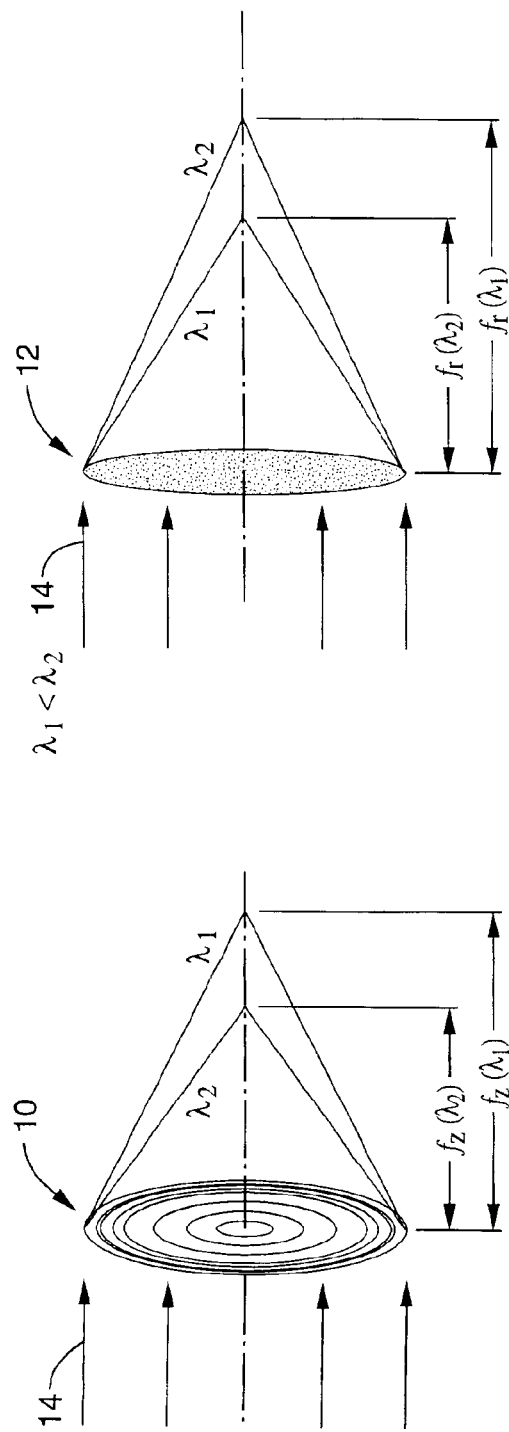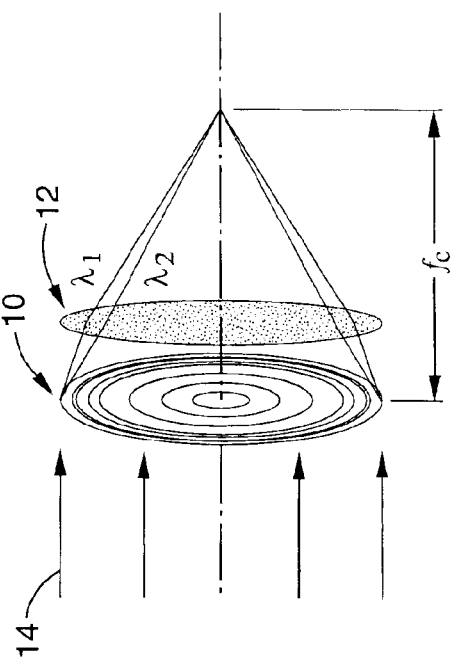
FIG. 1A
FIG. 1B
FIG. 1C

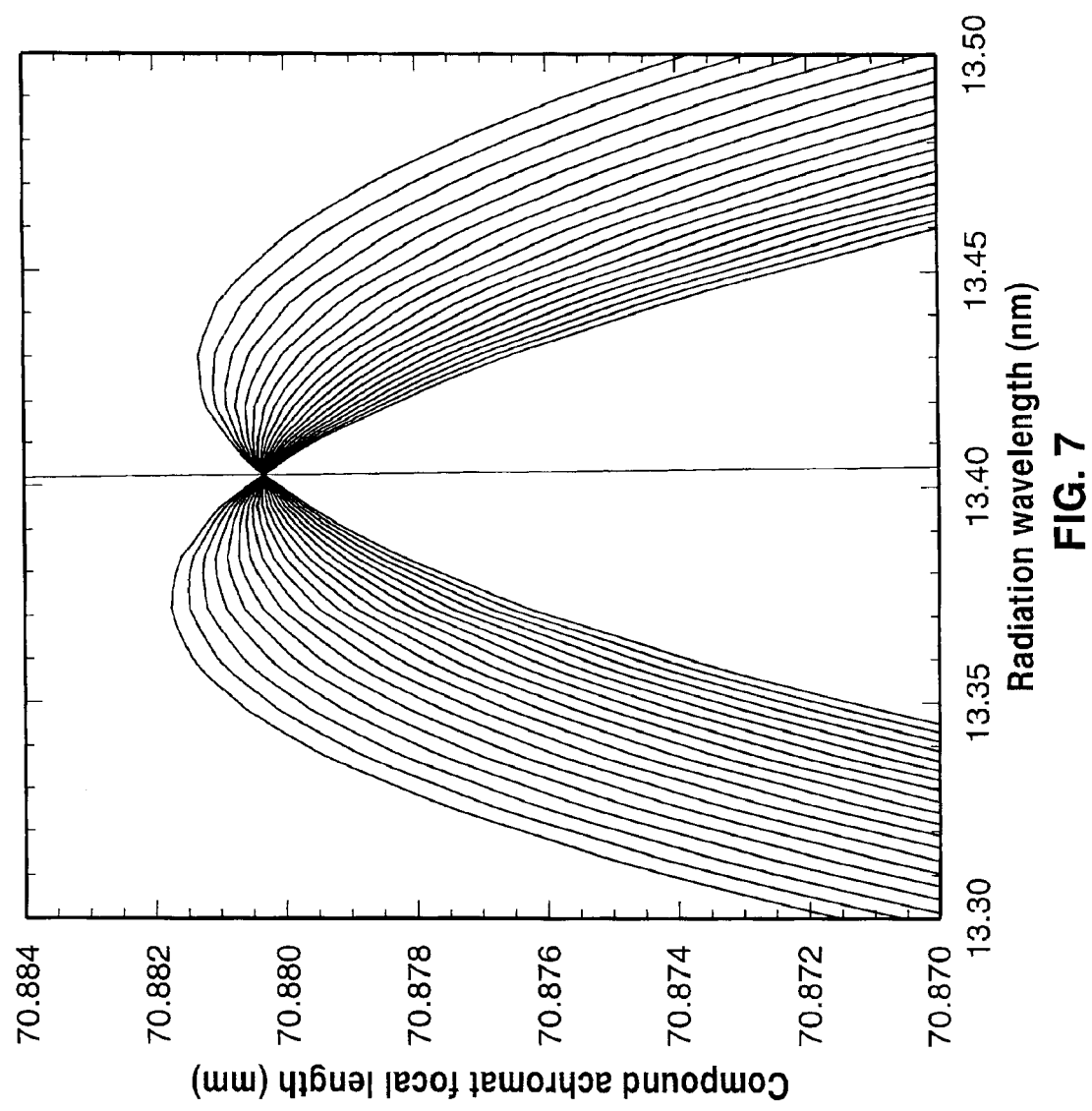

ACHROMATIC FRESNEL OPTICS FOR ULTRAVIOLET AND X-RAY RADIATION

CROSS-REFERENCE TO RELATED APPLICATIONS

This application claims priority from U.S. Provisional Application Ser. No. 60/337,752 filed on Nov. 9, 2001, incorporated herein by reference, and from U.S. Provisional Application Ser. No. 60/338,362 filed on Nov. 9, 2001, incorporated herein by reference.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

1. Field of the Invention

The present invention pertains generally to transmission type optics for short wavelength electromagnetic radiation, and more particularly to an achromatic lens (a lens corrected for chromatic aberration for a specified wavelength range) for focusing electromagnetic radiation in the extreme ultraviolet (EUV) and x-ray regime with wavelengths ranging from 0.02 nm to 20 nm.

2. Description of the Background Art

The past decade has seen rapid development of optical components for 0.02–20 nm electromagnetic radiations. Diffractive, refractive, and reflective methods have all been utilized to focus short wavelength electromagnetic radiation. Of these three categories, a diffractive lens implemented as a Fresnel zone plate provides the highest resolution of approximately 25 nm with wavelengths longer than 2 nm, and 100 nm at shorter wavelengths.

There are several types of Fresnel zone plates. An amplitude zone plate consists of concentric opaque rings arranged such that the radiation passing through the rings arrives at the focal point in phase, while the out-of-phase radiation is absorbed by the rings. Alternatively, a phase zone plate's rings shift the phase of the radiation instead of simply absorbing the radiation. If the rings are designed to shift the phase of radiation by $\pi$, the theoretical maximum efficiency is 40%, quadrupled from about 10% for that for an amplitude zone plate. Both types of zone plates above are called binary zone plates since the zones (rings or empty) are of approximately equal height. A blazed zone plate consists of rings of varying heights within that are designed to provide continuous phase shifting for improving focusing efficiency. An ideal blazed zone plate in theory can provide 100% efficiency.

The focal length of a Fresnel zone plate is given by $f_z = 2R\Delta R/\lambda$, where $\lambda$ is the wavelength, R is the radius of the Fresnel zone plate, and $\Delta R$ is the width of the finest, outermost zone. The spatial resolution of a zone plate is $0.61\lambda/N.A. = 1.22\Delta R$ according to the Rayleigh criteria, where N.A. is the numerical aperture of the zone plate. For a given Fresnel zone plate, the focal length depends on wavelength, and it is a chromatic lens. The monochromaticity requirement for a Fresnel zone plate is $\Delta\lambda/\lambda < 1/N = (2\Delta R/R)$, where N is the number of zones. For an example, assume a Fresnel zone plate were to be made to have a diameter of 6 mm and outer zone width of 70 nm. It would have over 21,000 zones. Its useful bandwidth would be less than 0.005%, which is difficult to achieve and generally does not efficiently use radiation produced in a typical x-ray source.

It is difficult to make refractive lenses for short wave (e.g., 0.02 nm to 20 nm) electromagnetic radiation because the index of refraction for most materials is close to unity and attenuation is relatively high. The complex index of refraction of a material is generally expressed as $$n = 1 - \delta - i\beta \qquad (1)$$
$$= 1 - \alpha\lambda^2(f_1 + if_2),$$

where $\alpha = n_a r_e/(2\pi)$ is a constant and is determined by the atom number density $n_a$ and the classical radius of the electron $r_e$, and $(f_1 + if_2)$ represents an effective number of electrons per atom. When a beam of short wavelength electromagnetic radiation transmits through a material of thickness t, its phase is advanced relative to vacuum by $2\pi\alpha\lambda f_1 t$, and its intensity is attenuated by $\exp(-4\pi\alpha\lambda f_2 t)$. As the wavelength decreases, $f_2$ generally decreases with wavelength to the third power except near an absorption edge, while $f_1$ generally changes little except near the absorption edge. This property was used in recent years for producing transmission lenses with limited capabilities. The focal length of a refractive lens with a single spherical convex surface is $f_r = R_C/(n-1)$; and becomes $f_r = -R_C/(\alpha\lambda^2 f_1)$ when n is substituted using Expression (1). The focal length is usually very long for single refracting surfaces. To make a refractive objective with an acceptably short focal length for focusing short wavelength electromagnetic radiation of wavelength less than 1 nm, a number M of these lenses can be stacked up within a distance small compared to $f_r$ to produce a compound focal length of $f_r/M$. Because the focal length depends on the wavelength, a refractive lens is also chromatic. The highest resolution achieved by refractive lenses up to date is about 300 nm. In addition, the attenuation also limits the size of the field of view in a refractive lens, as the thickness of lens increases with the lens diameter.

Mirror reflective focusing optics is intrinsically achromatic, especially when the mirror has only one single reflecting surface. For a multilayer focusing mirror, a finite bandwidth is required for obtaining effective reflection but not for achromaticity. A mirror operating at grazing incidence usually has a small field of view due to various geometric aberrations. It is therefore generally not well suited for imaging applications requiring a large field of view. The best resolution obtained from a grazing incidence mirror is larger than 250 nm. Operating at normal or near normal incidence, a mirror generally has less aberration than that operating at a grazing incidence, but its field of view is generally limited. In order to increase the field of view for both grazing and normal incidence cases, two of more reflecting mirrors are required. Examples include the well-established Wolter and Schwarzschild optics. For short wavelength radiation, the Wolter optics is limited in resolution due to difficulties associated with the requirement of making highly aspherical mirror surfaces. In comparison, the normal incidence employed in the Schwarzschild optics requires a multilayer coating for achieving adequate reflectivity. The multilayer coating requirement further limits the usable wavelength to the longer wavelength range, currently above 4 nm. The best resolution achieved up to date is about 500 nm and 50 nm by a Wolter and Schwarzschild optic, respectively.

The present invention seeks to provide an achromatic lens that overcomes one or more of the above-described shortcomings.

BRIEF SUMMARY OF THE INVENTION

The present invention discloses a method of combining a diffractive Fresnel zone plate and a refractive lens or a refractive Fresnel lens to produce a compound Achromatic Fresnel Optic (AFO). The AFO has an achromatic bandwidth substantially larger than the individual components and a resolution approximately equal to that of the Fresnel zone plate component. The large achromatic bandwidth is achieved by canceling (correcting) the chromatic aberration of a Fresnel zone plate with a refractive (Fresnel) lens having a chromatic aberration of an opposite sign and furthermore an enhanced amplitude near an absorption edge in the 0.02–20 nm wavelength region. The focusing strength of the refractive (Fresnel) lens is much less than that of the Fresnel zone plate and thus the resolution of the AFO is approximately equal to that of the Fresnel zone plate.

In a preferred embodiment, the Fresnel zone plate and the refractive Fresnel lens are manufactured on a single substrate so that they are aligned with each other in production. The Fresnel zone plate can be fabricated on the substrate using techniques well known in the art. The Fresnel lens can be fabricated using methods disclosed in this invention. The use of a single substrate further allows the alignment between the Fresnel zone plate and Fresnel lens to be maintained with relative ease. It is to be understood that the diffractive and the refractive elements can also be fabricated on separate substrates and then aligned to form a compound lens. This construction method may lead to simpler production.

The invention further discloses methods of design and applications of the AFO. It can be appreciated that the AFO of the present invention can be used in a variety of applications utilizing EUV radiation and x-ray radiation. For example, the AFO can be used in a lithography camera in order to image a mask pattern on a wafer, or to inspect and to perform metrology on multilayer mask blanks and patterned multilayer masks. The AFO lens can also be used as an objective or condenser lens in a full-field imaging microscope, a scanning microscope, a point projection microscope, a collimator in a proximity lithography, or a telescope. In another application, a pair of AFOs can be used to expand or contract a coherent beam. The degree of expansion or contraction depends on the ratio of the focal length of the AFOs.

Further objectives and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only:

FIG. 1A through FIG. 1C are schematic diagrams illustrating an AFO comprising a Fresnel zone plate and a refractive Fresnel lens according to the present invention.

FIG. 7 is a graph of the combined focal length of an AFO according to the present invention having a silicon refractive lens plotted versus radiation wavelength.

DETAILED DESCRIPTION OF THE INVENTION

Figure 2:
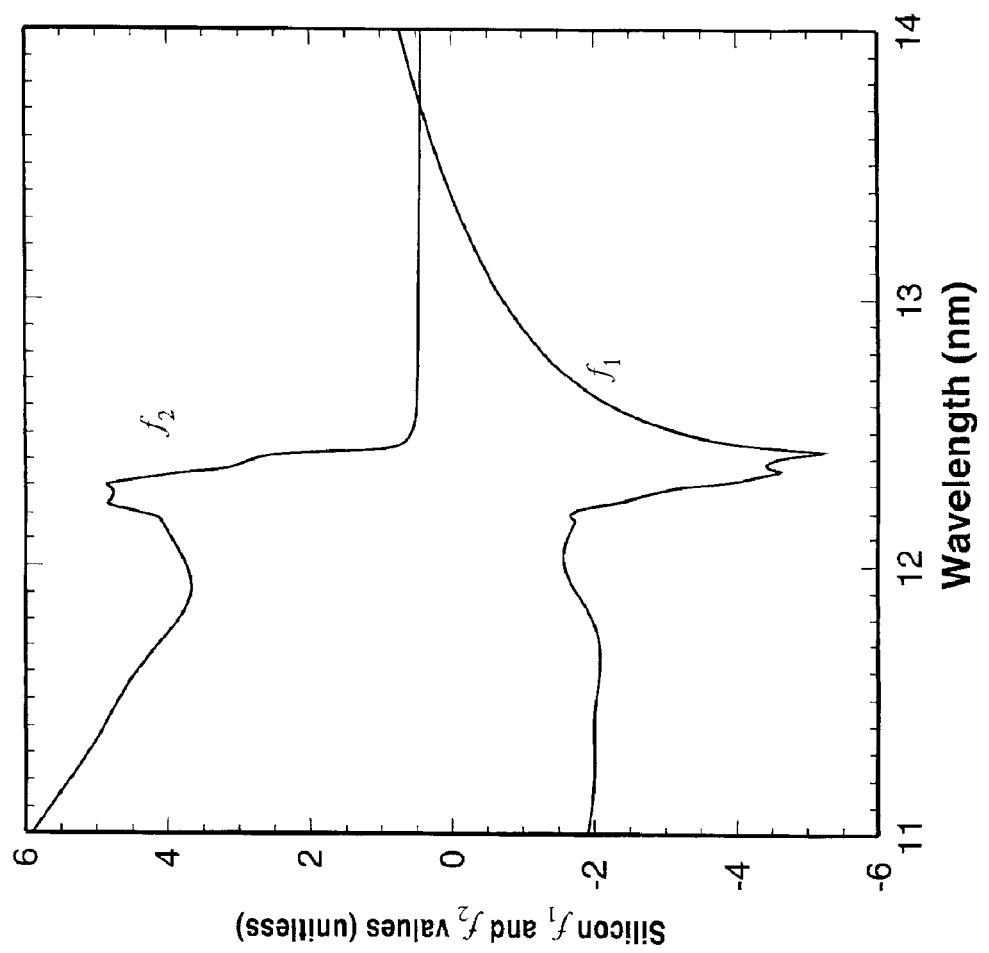
FIG. 2 is a graph of Silicon $f_1$ and $f_2$ values plotted versus radiation wavelength near the L-edge, illustrating the large change of $f_1$ as a function of wavelength near the absorption edge.

Referring first to FIG. 1, the basic principles of the present invention can be seen. FIG. 1 shows a Fresnel zone plate 10 and a refractive lens 12. FIG. 1 shows that the zone plate 10 and lens are subjected to radiation 14 (e.g., EUV and x-ray) having two wavelengths, $\lambda_1$ and $\lambda_2$, where $\lambda_1 < \lambda_2$. As shown, the Fresnel zone plate focal length $f_z$ varies such that $f_z(\lambda_1) > f_z(\lambda_2)$. The present invention recognizes that it is possible to design a refractive Fresnel lens such that $f_r(\lambda_1) < f_r(\lambda_2)$, and to form a compound AFO comprising the Fresnel zone plate 10 with the refractive Fresnel lens 12, where the combined focal length $f_c$ is the same for both wavelengths and, in addition, wherein the focal length for all wavelengths between $\lambda_1$ and $\lambda_2$ fall within the depth of focus (DOF). For purposes of the discussion herein, we refer to the central wavelength $$\frac{\lambda_1 + \lambda_2}{2}$$

as the Designed Operating Wavelength (DOW). Accordingly, the present invention further recognizes that the optimal DOW of an AFO is near an absorption edge of an element making up the Fresnel lens because of the large wavelength dependence of $f_r$.

The principle behind the AFO of the present invention can be explained as follows. For a small wavelength increase, $\lambda \to \lambda + \Delta\lambda$, the focal length of a Fresnel zone plate is given by $$f_z(\lambda + \Delta\lambda) = \frac{f_z(\lambda)}{1 + \Delta\lambda/\lambda}.$$

For the refractive lens, both the wavelength variation $\lambda^2 \to \lambda^2 + 2\lambda\Delta\lambda + (\Delta\lambda)^2$ and the wavelength dependence in the effective number of electrons $f_1(\lambda)$ should be considered. Here, we use the lowest order term of the Taylor series expansion of $f_1(\lambda)$ as a good approximation; that is $$f_1 \to f_1 + \frac{\Delta f_1}{\Delta\lambda}\Delta\lambda.$$

Keeping only first order variation terms, the focal length of the refractive lens can be expressed as $$f_r(\lambda + \Delta\lambda) = \frac{f_r(\lambda)}{1 + \frac{2\Delta\lambda}{\lambda} + \frac{\Delta f_1}{f_1}}. \tag{2}$$

If two lenses are separated by a small distance s, their combined focal length is given by $$\frac{1}{f_c} = \frac{1}{f_z} + \frac{1}{f_r} - \frac{s}{f_z f_r}. \tag{3}$$

In the limit $s \ll f_z, f_r$, the focal length $f_c$ of the resulting compound optic made up of a Fresnel zone plate and a refractive lens is $$\frac{1}{f_c(\lambda + \Delta\lambda)} = \frac{1}{f_z(\lambda + \Delta\lambda)} + \frac{1}{f_r(\lambda + \Delta\lambda)} \tag{4}$$

$$= \frac{1}{f_z(\lambda)}\left(1 + \frac{\Delta\lambda}{\lambda}\right) + \frac{1}{f_r(\lambda)}\left(1 + \frac{2\Delta\lambda}{\lambda} + \frac{\Delta f_1}{f_1}\right)$$

$$= \frac{1}{f_z(\lambda)} + \frac{1}{f_r(\lambda)} + \frac{\Delta\lambda}{\lambda}\left[\frac{1}{f_z(\lambda)} + \frac{1}{f_r(\lambda)}\left(2 + \frac{\lambda}{f_1}\frac{\Delta f_1}{\Delta\lambda}\right)\right]$$

From the foregoing, the key to the achromatic Fresnel objective can be seen; namely, the term in the last bracket [ ] is made zero so that there is no change in focal length over a wavelength range $\Delta\lambda$. This condition can be written as $$\frac{f_r(\lambda)}{f_z(\lambda)} = -\left(2 + \frac{\Delta f_1/f_1}{\Delta\lambda/\lambda}\right) = -(2 + D), \tag{5}$$

where $$D \equiv \frac{\Delta f_1/f_1}{\Delta\lambda/\lambda}$$

characterizes the dispersion, or the dependence of the refractive lens on the wavelength. It follows that the radius of curvature of the refractive lens can be determined as $$R_c = 2\alpha R \Delta R \lambda f_1 (2+D). \tag{6}$$

A similar analysis can be carried out if the separation between the AFO's two components is not negligible.

It will be appreciated that for the ease of fabrication of the refractive lens, it is advantageous to have a large radius of curvature, which requires a large dispersion. It is well known in anomalous dispersion theory that $f_1(\lambda)$ of a given material changes rapidly with wavelength near an absorption edge of a major element in the material. Therefore, for a given spectral range, it is preferred to make the refractive lens using a material containing an element having an absorption edge within the spectral range. In the case of a step-like rise in absorption as the wavelength is decreased (e.g., an EUV or x-ray absorption edge), $f_1(\lambda)$ has the shape of a "V" with the minimum of the dip occurring at wavelengths just above the wavelength of the absorption edge. The dependence of the refractive index near an absorption edge (also known as dispersion relation) is described by the Kramers-Krönig relation. FIG. 2 shows a plot of $f_1(\lambda)$ calculated using the Kramers-Krönig relation based on measured absorption data near the silicon L absorption edge. Within the "V" shaped spectral region, the value of D ranges from 50 to 100. In this spectral region, Equation (5) indicates that the focal length of the refractive lens is much larger than that of the Fresnel zone plate. Furthermore, Equation (6) can be approximated as:

$$R_c \approx 2\alpha R \Delta R \lambda f_1 (2+D) \tag{7}$$

$$= \alpha \times (2R\Delta R) \times \lambda^2 \times \frac{\Delta f_1}{\Delta\lambda}.$$

Here we see that the radius of curvature of the refractive lens depends on a constant $\alpha$, zone plate parameters R and $\Delta R$, designed operating wavelength $\lambda$, and the dispersion property $$\frac{\Delta f_1}{\Delta\lambda}$$

of the refractive lens material. It is generally preferable to use the long wavelength (lower in energy) part of the "V" spectral region because the absorption attenuation of the transmitted radiation is much lower than the corresponding short wavelength part. For material with absorption edges at much shorter wavelengths (less than 1 nm) where absorption is less of a concern, wavelengths above the absorption edge can be used. The required shape of the refractive lens is convex if the DOW is in longer than the wavelength corresponding to the minimum of $f_1(\lambda)$, and is concave if the DOW is shorter. Finally, since the focal length of the refractive lens 12 (FIG. 1) is much larger than the zone plate 10 (FIG. 1), the resolution and depth of field of the compound AFO are approximately equal to those of the Fresnel zone plate component.

Figure 3:
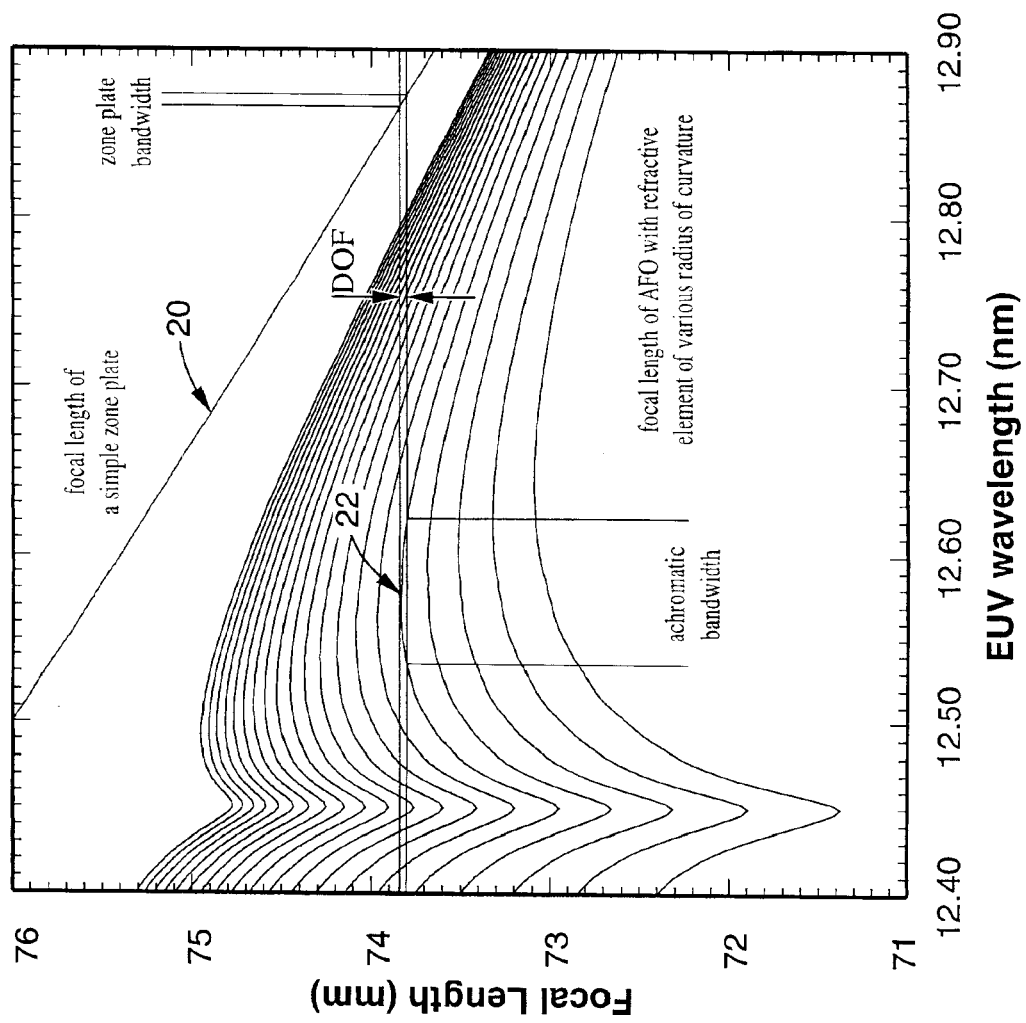
FIG. 3 is a graph of the focal length of a Fresnel zone plate and a compound AFO lens plotted as a function of radiation wavelength, illustrating that the dependence of the AFO's focal length on wavelength is substantially smaller than the Fresnel zone plate.

FIG. 3 shows the behavior of the combined focal length $f_c$ for an example achromatic Fresnel optic as a function of radiation wavelength. The upper straight line 20 shows that the focal length of the zone plate 10 is inversely proportional to the radiation wavelength. However, when combined with the refractive lens 12, as shown in FIG. 1, the straight line 20 can be bent so that within certain bandwidths, the combined focal length changes little (e.g., curved line 22), demonstrating that the AFO has much wider achromatic bandwidth than the Fresnel zone plate. It is to be understood that the two extreme or bandwidth-defining wavelengths can be selected such that $f_c$ for all wavelengths between them also falls within the depth of field. Moreover, because of the aforementioned difficulties associated with making refractive lenses, the Fresnel zone plate 10 is preferably the principal focusing element and the refractive lens 12 is preferably used to recombine the light of different wavelengths dispersed by the zone plate 10.

The degree of bending of radiation by the refractive lens depends on its radius of curvature. As shown in FIG. 3, the higher curves (closer to the simple zone plate) result from corrective refractive lenses with larger radius of curvature, or a weaker lens. As the radius is decreased (or as the refractive lens becomes stronger), the focal length of the compound lens deviates more from that of the simple zone plate and at the same time, the operating wavelength is shifted away from the absorption edge while the curve near the DOW becomes flatter, resulting in wider bandwidth. It is therefore recognized that the refractive lens has a strong influence on the DOW and the bandwidth. Consequently, its design must also take into account spectral characteristics of other components of the systems such as the source spectrum and condenser spectral response etc. In practice, further considerations such as related fabrication technology and previous experience, etc. must also be included. For an example, much experience has been gained in EUV lithography programs for energies between ninety-five and one hundred electron volts (95 eV and 100 eV) and x-ray lithography programs for energies near one kilo electron volts (1 keV) energy. Sources, reflective optics, and monochromators are well developed for these energies. It is advantageous to leverage on these experiences and resources to develop the applications, discussed below, that uses the achromatic Fresnel lens of the present invention.

Another factor that must be considered when designing the AFO is the fabrication of the refractive lens in conjunction with the zone plate. Traditionally, zone plates have been fabricated on silicon substrates, much like microchips. Therefore, it is very convenient to use the same silicon substrate to fabricate the refractive lens thereon. Techniques for etching silicon with high accuracy have also been well developed. Material properties must also be considered. Silicon, chromium, and copper have all been used extensively for fabricating nanostructures and as such are the preferred materials for manufacturing the present invention.

A few non-limiting AFO design examples are listed in Table 1.

The maximum thickness $t_C$ of the refractive lens is:

$$t_C = R_C - \sqrt{R_C^2 - R^2} \approx \frac{R^2}{2R_C}. \tag{8}$$

Especially at EUV wavelengths, this thickness may be large enough to absorb an unacceptably large fraction of the incident intensity. One strategy for dealing with this issue is to replace the refractive lens with a refractive Fresnel lens so that the overall curvature can be maintained within a stepwise approximation while decreasing the refractive lens thickness to acceptable values.

Figure 6:
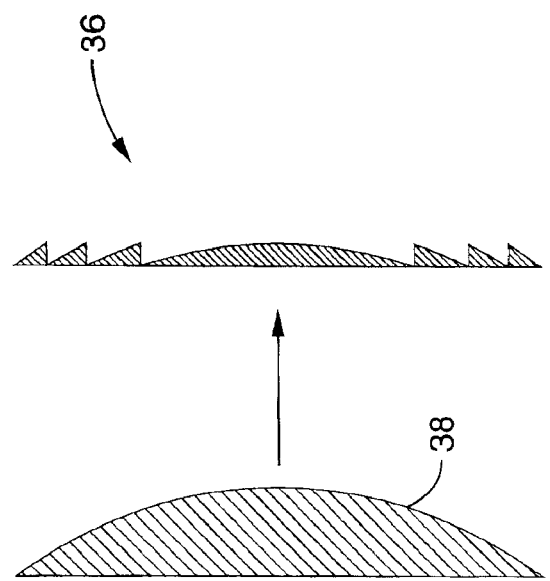
FIG. 6 is a side view of a simple refractive lens compared to a thinner refractive Fresnel lens of the type shown in FIG. 4.
Figure 5:
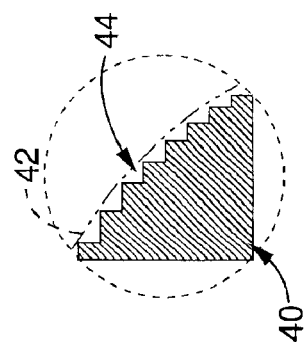
FIG. 5 is a detailed side view of a portion of the achromatic Fresnel optic of FIG. 4 showing a non-limiting example of a staircase profile that approximates the curved lens surface.
Figure 4:
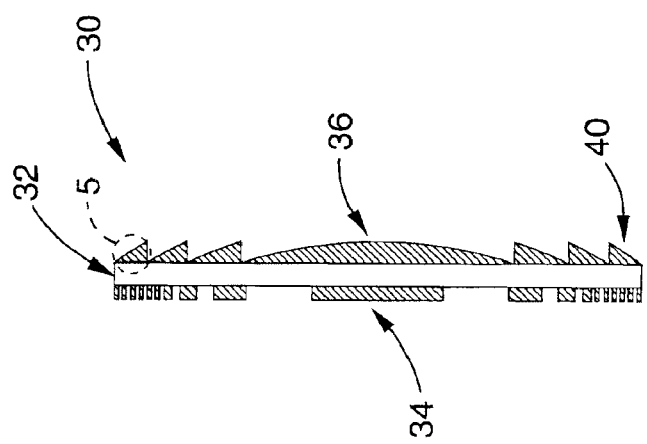
FIG. 4 is a side view of an achromatic Fresnel optic according to the present invention.

Referring now to FIG. 4 and FIG. 5, a preferred, non-limiting example of an AFO constructed from silicon is shown and generally designated 30. FIG. 4 shows that the AFO 30 includes a preferably silicon substrate 32 on which a silicon zone plate 34 and silicon refractive lens 36 are constructed. It is to be understood that, since a simple refractive lens may be too thick for achieving acceptable transmission of short wavelength radiation, the preferred refractive lens 36 is a refractive Fresnel lens for improving the throughput of the AFO. For example referring to the leftmost portion of FIG. 6, a simple refractive lens 38 listed in the first row of Table 1 having a central thickness of 0.42 mm is too thick to use with EUV light having an 1/e absorption of 0.55 μm. As shown in the rightmost portion of FIG. 6, the solution is to produce a thinner refractive Fresnel lens 36, preferably on the same substrate as the zone plate 34 as shown in FIG. 4.

If the maximum thickness of the refractive Fresnel lens 36 is 1.25 μm, corresponding to 2π phase at the DOW, approximately 20% average transmission can be achieved. Such a Fresnel lens has about three-hundred and forty bands 40. Much like a diffractive zone plate, the width of the bands are coarse near the center of the lens and finer near the edge. In the preferred design, the outermost band is about 7.4 μm, which can be produced with photo-induced chemical etching techniques. In practice, a smooth spherical shape is difficult to produce accurately, but the curvature 42 can be approximated by making a plurality of steps 44 in each band as shown in FIG. 5. With current nano-fabrication technology, zone plates with efficiency of 50% have been demonstrated. This yields a combined efficiency of about 10% for the achromatic lens. It is to be understood that the above construction method is preferred because large separation values, s, have the tendency of decreasing the bandwidth. Also, fabricating both elements on the same substrate makes it easier to align them and maintain that alignment. It is, however, also possible to construct both lens elements on separate substrates and align them later. This separate construction method may simplify the fabrication procedures at large-scale production beyond the prototype demonstration.

Note that the 2π phase shift depth is only exactly true for the DOW. At other wavelengths within the bandwidth, a small wavefront error of 0.01λ to 0.1λ will occur. However, the degradation to the performance of the lens from this error may be negligible for most applications.

To further improve the throughput of the compound optic, the maximum thickness of the Fresnel lens can be made thinner to arbitrary thickness while the phase error introduced can be canceled by adjusting the zone positions of the Fresnel zone plate. As a non-limiting example, we may choose the make the maximum thickness of the Fresnel lens to be 0.625 μm, corresponding to π phase shift. Then the rays from neighboring bands will arrive at the focal point out of phase and therefore fail to focus. We can shift the position of the zones (rings) of the zone plate that lie within alternate bands by one zone (half the zone/space period). Consequently, an additional π phase shift is produced by the zone plate, canceling the π generated by the refractive lens. This example would have about combined efficiency of about 25%, more than doubling the previous one with maximum thickness corresponding to 2π phase shift. It is noted that this method is practical since the zone plate is most often patterned by an electron beam writer typically with a much higher positioning accuracy than the zone width.

For electromagnetic radiation of wavelength loner than about 1 nm, the $f_1$ value of many elements crosses zero during its pre-edge decline (see FIG. 2). If the DOW is designed to be the zero-crossing point, the refractive Fresnel lens can be of arbitrary thickness, while requiring no additional compensation from the zone plate. In this case, the Fresnel lens acts as an absorber and a wavelength (counter) disperser: for radiation exactly at the DOW, no phase shift is produced. While radiation at other wavelengths within the bandwidth will be dispersed according to design to converge at the focal point, no net phase shift is produced. This is the preferred regime to construct an achromat according to the methods discussed above.

The size of the zone plate and imaging field are likely to be limited by the primary aberrations. When imaging finite conjugates with object distance p and image distance q for off-axis angle of θ, the Seidel wavefront (primary) aberrations are:

spherical aberration:

$$\frac{3r^4(q-f)}{8f^2q^2} \quad (9)$$

coma:

$$\leq \frac{\theta r^3}{2}\left(\frac{1}{q^2} - \frac{1}{p^2}\right) \quad (10)$$

astigmatism:

$$-\frac{r^2\theta^2}{2f} \quad (11)$$

field curvature:

$$-\frac{r^2\theta^2}{4f} \quad (12)$$

The distortion term is always zero, i.e. a Fresnel zone plate always produces distortion-free images. To obtain diffraction-limited images, these terms should be kept under λ/4.

As a non-limiting example, we first look at the maximum zone plate size and image field size attainable for an AFO without any monochromatic aberration correction for 4:1 demagnifying imaging. At DOW of 1.33 nm, the AFOs in Table 1 have outer most zone width of between 41 nm and 95 nm, hence the numerical apertures are quite small, ranging from 0.032 to 0.014. Imaging fields between 2 mm and 15 mm can be obtained. When used with EUV radiation at 12.5 nm wavelength, the numerical apertures are increased nearly ten fold. The primary aberrations become problematic when the zone plate consists of more than a few hundred zones. For an example, for a zone plate with 95 nm outer zone width, diffraction limited images can be obtained if the zone plate has a diameter of less than 0.5 mm and an imaging field of 0.15 mm. This can be increased significantly if aberration corrections are applied. A well-known technique used in designing refractive lenses for visible light regime is to adjust the bending factor defined as $$B = \frac{R_2 + R_1}{R_2 - R_1} \quad (13)$$

where $R_1$ and $R_2$ are the lens radii of curvature. A zone plate can be interpreted as a hologram produced by a reference wave originating from distance $R_{Ref}$ and a point object from distance $R_{Obj}$. The bending factor for a zone plate can then be similarly defined as $$B = \frac{R_{Ref} - R_{Obj}}{R_{Ref} - R_{Obj}}, \quad (14)$$

It has been shown that by adjusting the value of B, all primary aberrations of a zone plate can be simultaneously minimized. For an example, by computing zones for specific finite conjugate imaging, spherical aberration can be eliminated completely at the designed conjugates. (It will, however, appear at other conjugates.) In accordance with the present invention, we exploit this property to correct the aberrations of an AFO; namely, the astigmatism and field curvature can be reduced by increasing the size of the AFO while maintaining the same of the field of view. Coma can be reduced or eliminated by placing a field aperture near or at the natural position. The distortion term is zero. That is, a zone plate, and therefore an AFO, produces distortion-free images.

Referring to FIG. 7, the focal length of the AFO 30 listed in the fourth row of Table 1 is shown as a function of energy for various refractive lens radius of curvature. From the graph, it can be observed that the if the radius of curvature is 6 mm, a bandwidth of 1.2 eV or 1.3% can be achieved. Note in the figure that the near-vertical line at the center of the graph is the zone plate focal length. It is to be understood that the tolerance for manufacturing can be quite high. The primarily effect of a small deviation from the designed radius of curvature is a shift in the DOW, it has a very small effect on other performances, such as bandwidth or throughput. In this example, a 10 μm) or 0.17% error in the radius of curvature results in 0.003 nm or 0.023% shift in the operating wavelength.

Figure 8:
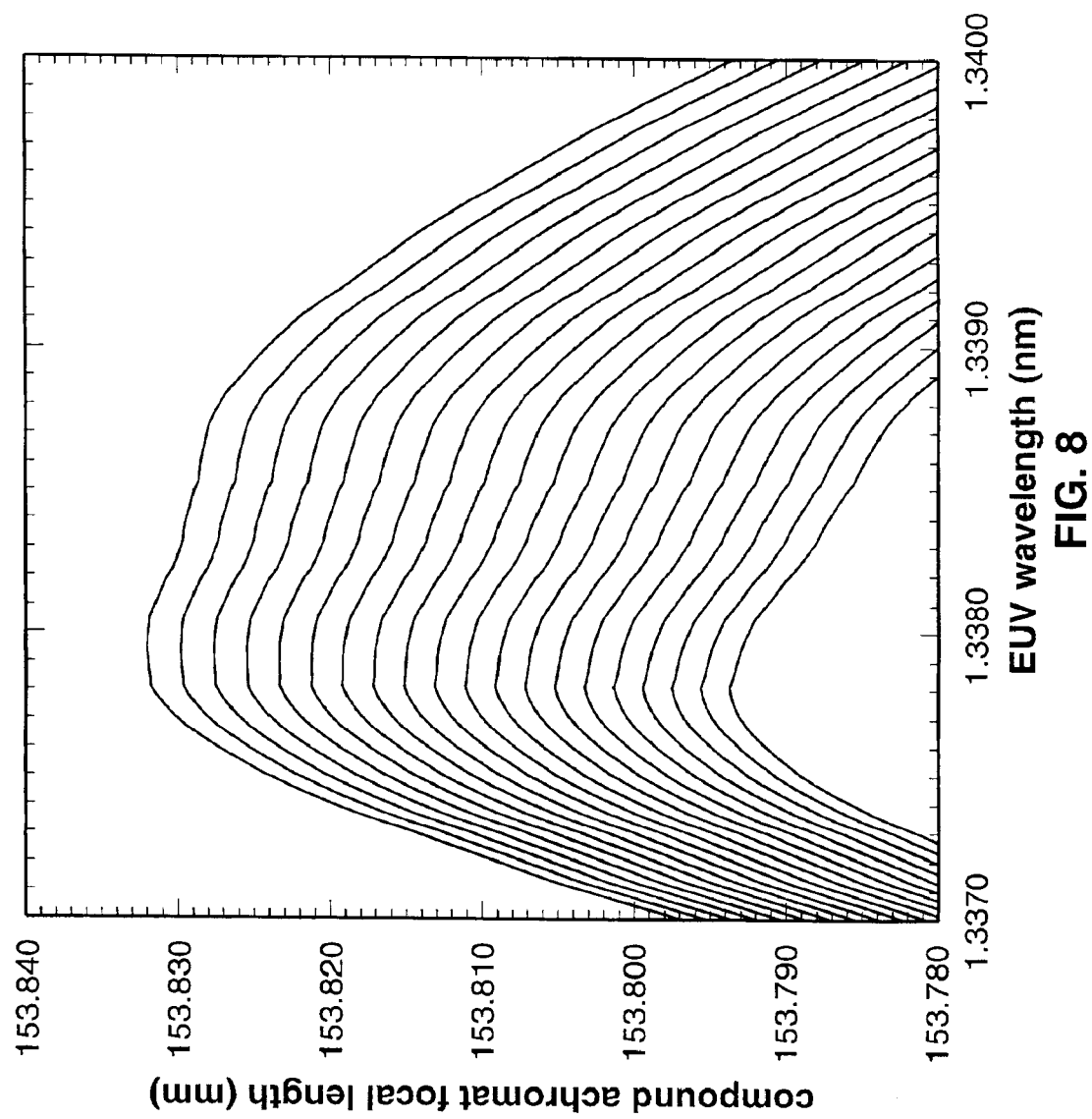
FIG. 8 is a graph of the combined focal length of an AFO according to the present invention having a copper refractive lens plotted versus radiation wavelength.

When higher resolution than that discussed above is required for a large imaging field (e.g., lithographically printing 30 nm to 40 nm nodes), the EUV radiation's relative large wavelength requires a large numerical aperture (e.g., NA of approximately 0.25) lens, which demands very elaborate aberration corrections and severely reduces depth of field (0.2 μm). It is appreciated that shorter wavelength radiation is preferred because simpler aberration corrections may be adequate. For example, radiation of ~1 keV energy, which are used in proximity x-ray lithography, can be used in a lithography system using an AFO as the objective lens. In this case, the refractive lens 36 can be fabricated from copper (L-edge) or sodium based crystalline salt (sodium K-edge). FIG. 8 shows the focal length, $f_c$, of the AFO 30 (FIG. 4) with a 25 mm diameter, a 95 nm outer zone width, and a copper refractive element as a function of energy. If the refractive element has a radius of curvature of 500 mm, an achromatic bandwidth of 1 eV or 0.1% can be obtained. An equivalent Fresnel lens with a 0.5 μm thickness would have an outer zone width of 20 μm. The relatively narrow bandwidth results from the narrow L-absorption of copper. If alternatively a wider K-absorption edge of sodium is used, the bandwidth can be increased to three electron volts (3 eV), or three tenth of a percent (0.3%). It is recognized that if wider bandwidth is desired, an additional refractive lens can also be added to correct the chromatic aberration at three wavelengths, thus forming an apochromatic lens.

Current nano-fabrication technology can produce zone plates with an outer zone width small as approximately 20 nm. Therefore, AFOs of much higher resolution than the above examples can be produced. Example parameters are listed in Table 1. All the parameters listed in Table 1 are well within the limit of current fabrication technology and can be readily utilized to produce 20 nm structures in lithography applications.

It will be appreciated that if a concave refractive lens can be used in conjunction with the zone plate in the same scheme as described above to greatly enhance the chromaticity of the zone plate. The result is a focus element with high resolution in both spatial and energy domains. Also, note that the zone plate is not limited to a circular configuration as described. While the zone plate will focus in two dimensions if it is circular, a linear zone plate can be used if it is only necessary to focus in one dimension.

From the foregoing it will be appreciated that various lens configurations are possible. For example, by adding another downstream lens to expand bandwidth, it is possible to correct for three λ's. In other words, increasing the number of downstream refractive lenses (e.g., Fresnel lenses) will expand bandwidth. Similarly, additional diffractive lenses could be added upstream.

It will also be appreciated that the AFO of the present invention can also be used in a wide range of imaging, spectroscopy, and diffraction applications. A few non-limiting examples are discussed below. It will be appreciated that, in the examples below, references to an AFO are intended to mean an AFO as previously described herein (e.g., AFO 30 in FIG. 4) but used in the configurations described below.

Figure 9:
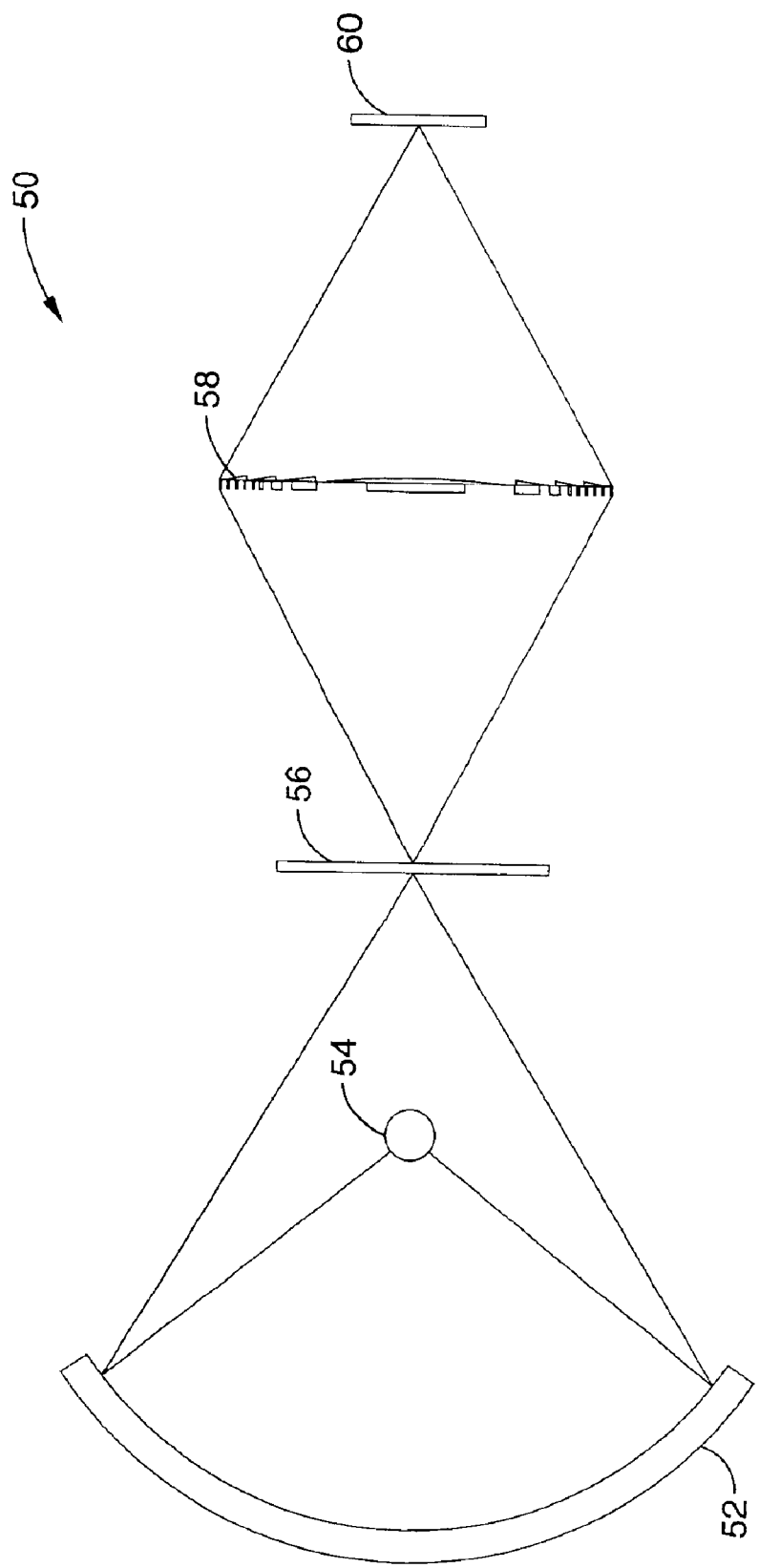
FIG. 9 is a schematic diagram of a lithography apparatus using an AFO of the present invention as an objective lens.

For example, referring to FIG. 9, a lithography system is shown and generally designated 50. FIG. 8 shows that the lithography system 50 includes a condenser 52, such as a reflective condenser or an AFO condenser. A radiation source 54 is placed so that it can emit radiation into the condenser 52. As shown, the condenser 52 projects the radiation through a mask 56, through an AFO 58, and onto a wafer 60. Accordingly, the mask pattern is imaged to the wafer by the AFO 58. The printing field is listed in Table 1 for a 4:1 demagnifying geometry.

Figure 10:
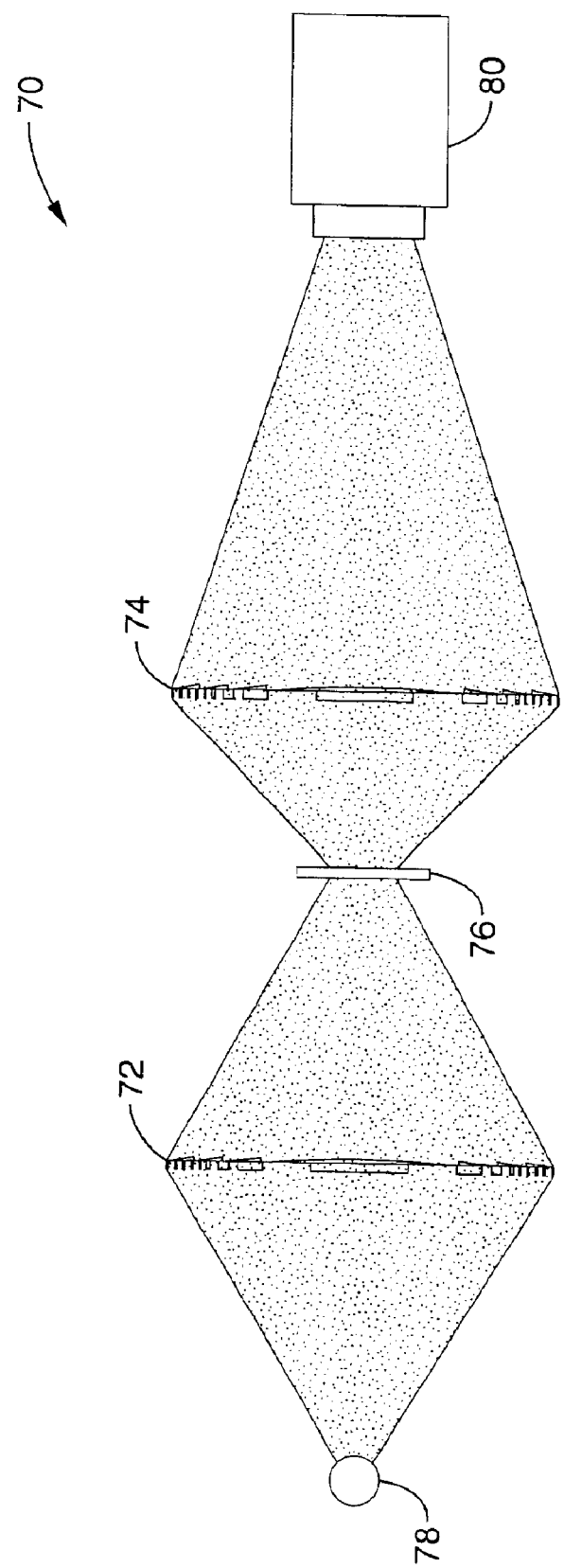
FIG. 10 is a schematic diagram of a full-field imaging microscope using an AFO of the present invention as an objective lens. Also shown is a scheme using the AFO as a condenser.

FIG. 10 shows a full-field imaging microscope, designated 70. As shown in FIG. 10, the microscope 70 includes a condenser 72 which could be an AFO or other type of condenser. An AFO lens 74 is spaced at a predetermined distance from the condenser 72 and a sample 76 is placed there between. Moreover, a radiation source 78 is placed adjacent to the condenser 72 and a detector 80 is placed adjacent to the AFO lens 74. As shown in FIG. 10, the condenser 72 projects radiation from the source 78 to the sample 76. The sample 76 is then magnified by the AFO lens 74 to the area detector 80. Also as shown in FIG. 10, the AFO lens can be used as a condenser 72 lens to project the source to the sample. It is to be understood that alternative contrast mechanisms, such as phase contrast, interference contrast, and dark fields are also applicable. The resolution of the example AFOs according to the Rayleigh criteria are listed in Table 1.

Figure 11:
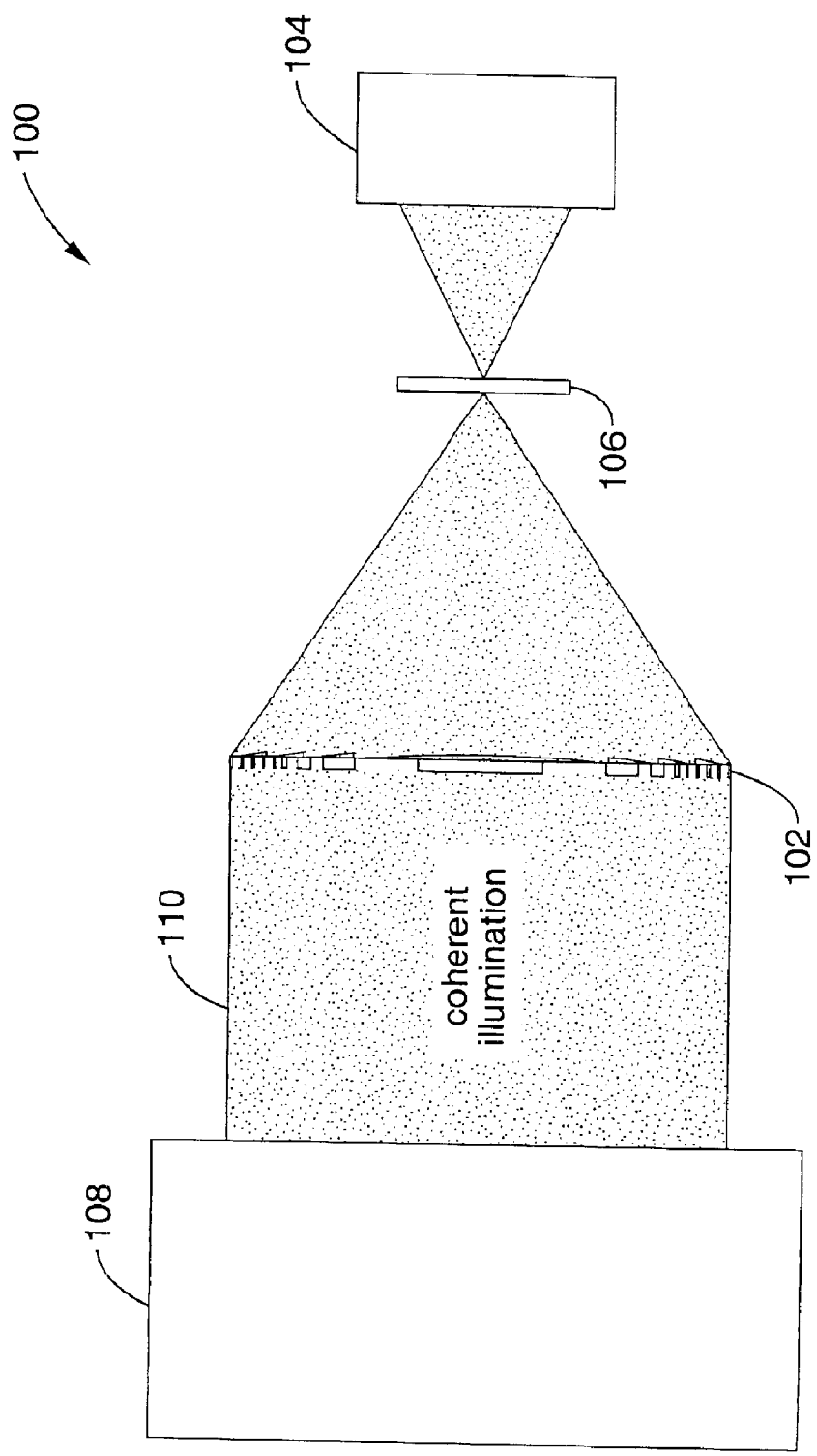
FIG. 11 is a schematic diagram of a scanning microscope using an AFO of the present invention to form a small probe.

Referring now to FIG. 11, a scanning microscope is shown and generally designated 100. FIG. 11 shows that the scanning microscope 100 includes an AFO focusing element 102 and a detector 104. A sample 106 is typically placed between the AFO focusing element 102 and the detector 104. A source 108 provides coherent illumination 110 that is focused to a point by the AFO focusing element 102. The sample 106 is raster scanned around the focal point while the transmitted flux is collected by the detector 104. Again, it is to be understood that alternative contrast mechanisms, such as phase contrast, interference contrast, dark field, elemental specific x-ray fluorescence contrast, and diffraction contrast are also applicable. The resolution of the example AFOs according to the Rayleigh criteria are listed in Table 1.

Figure 12:
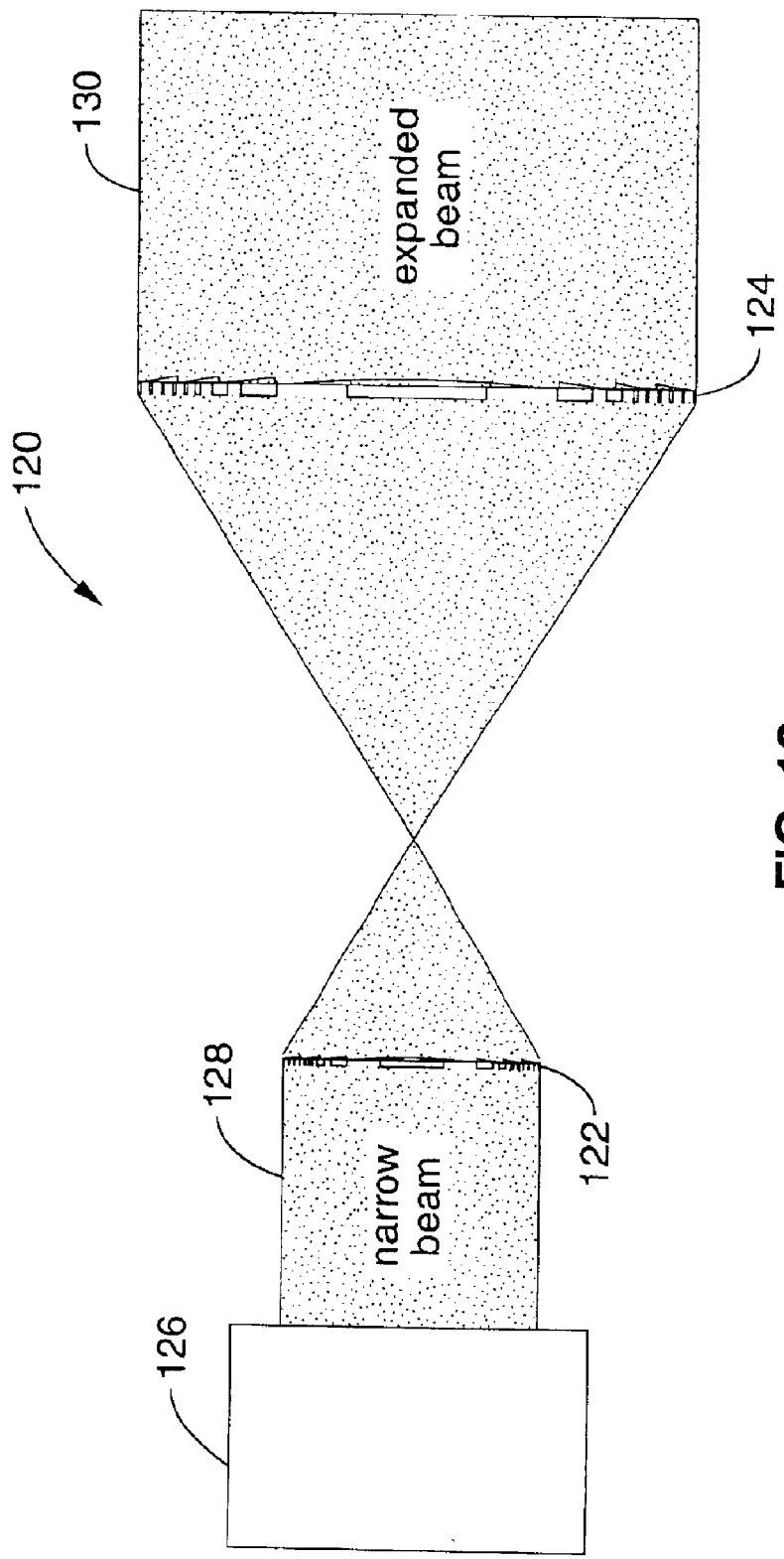
FIG. 12 is a schematic diagram of a beam expander using a pair of AFOs of the present invention.

FIG. 12 shows a beam expander, generally designated 120. As shown in FIG. 11, a first AFO 122 and a second AFO 124 are arranged in a confocal manner. A source 126 can be used to produce a beam 128 that is projected through the AFOs 122, 124 to produce an expanded beam 130. It can be appreciated that beam 128 can be expanded or contracted using this beam expander 120 with little change in coherence properties. The degree of expansion or contraction depends on the ratio of the focal length of the two AFOs 122, 124.

Figure 13:
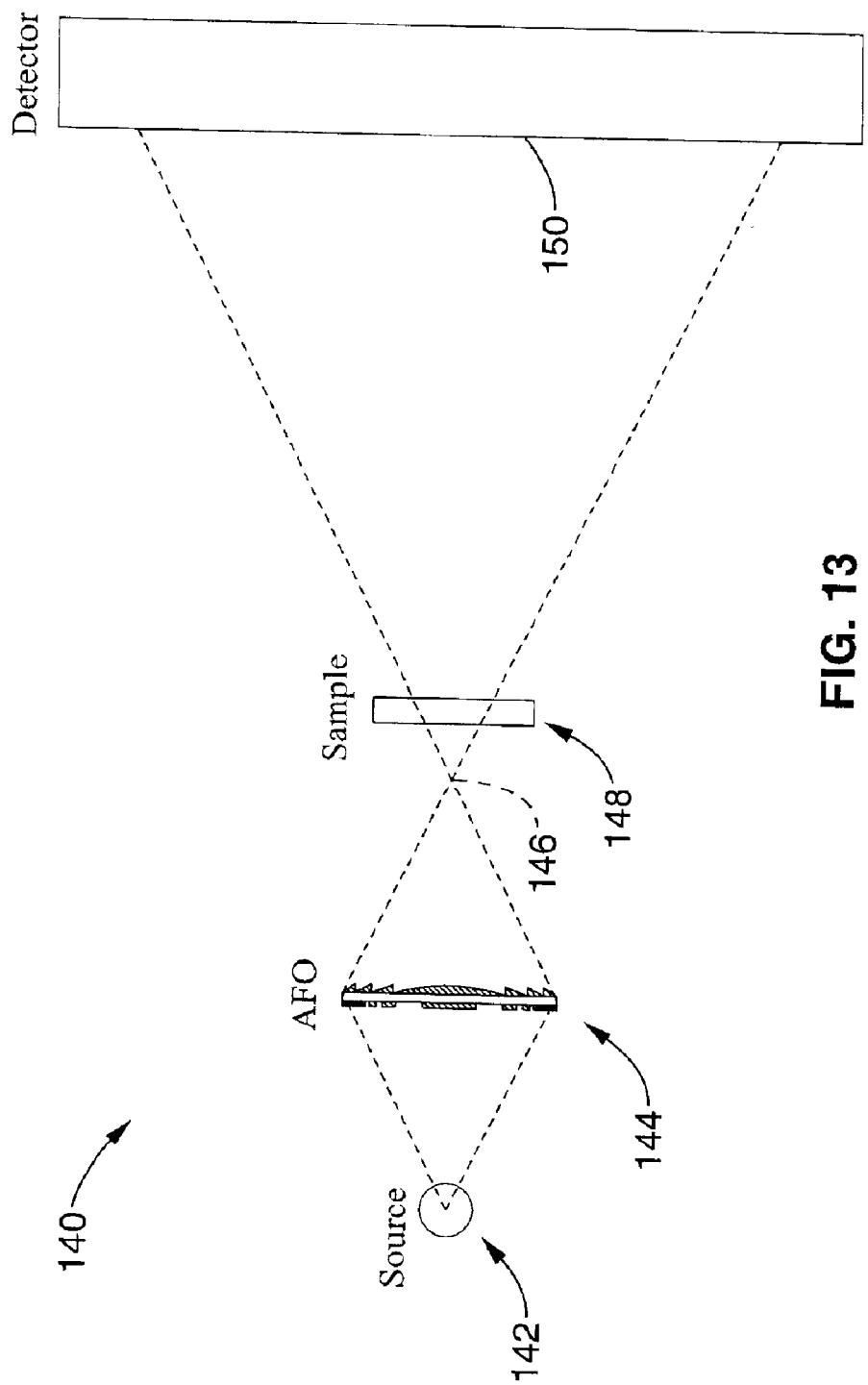
FIG. 13 is a schematic diagram of a projection imaging apparatus using an AFO to form a small point source.

FIG. 13 shows an AFO used to form a small spot in a direct projection imaging apparatus 140. As shown in FIG. 12, the AFO 142 focuses the source 144 to a small spot 146.

The radiation projected from the virtual source 146 interacts with the sample 148 and is then recorded by the detector 150. The magnification of the system is determined by the geometry. A preferred embodiment is to use the AFO 142 to produce a focal spot substantially smaller than the source to obtain high resolution images.

Figure 14:
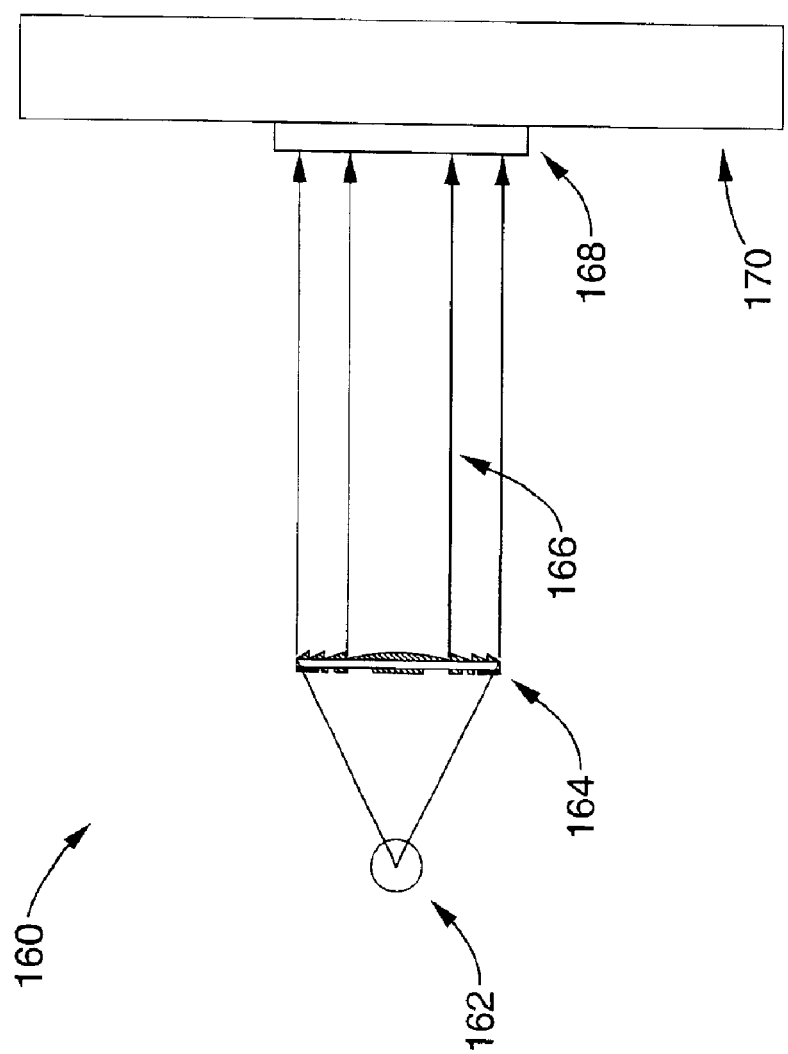
FIG. 14 is a schematic diagram showing the use of an AFO as an objective lens to produce a collimated beam for proximity lithography applications.

FIG. 14 shows an AFO used as an objective lens to produce a collimated beam in an apparatus 160 for proximity lithography applications. In FIG. 14, the source 162 is placed at the front focal plane of the AFO 164. The beam passing through the AFO 164 will collimated into a plane wave beam 166. The plane wave beam 166 will reach the sample 168 and the transmitted beam will be recorded onto the recording medium 170.

Figure 15B:
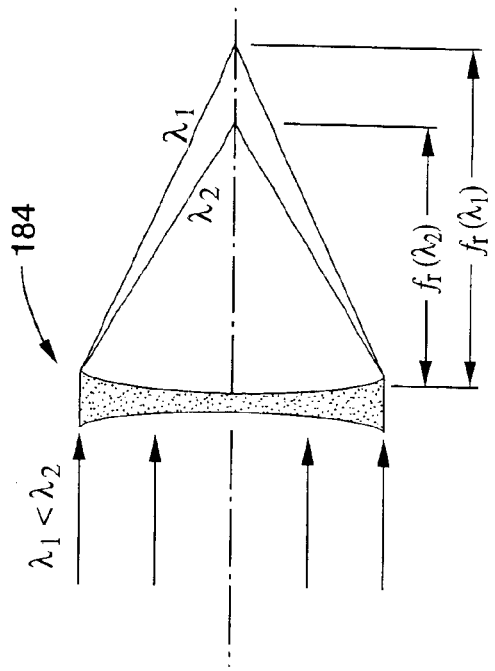
FIG. 15A through FIG. 15C are schematic diagrams showing a spectrometer using a similar principle as the AFO of the present invention, but where the refractive lens is used to enhance the spectral dispersion instead of correcting it.
Figure 15C:
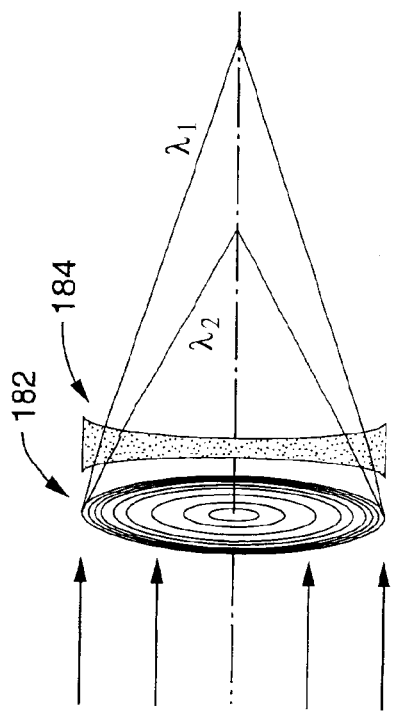
Figure 15A:
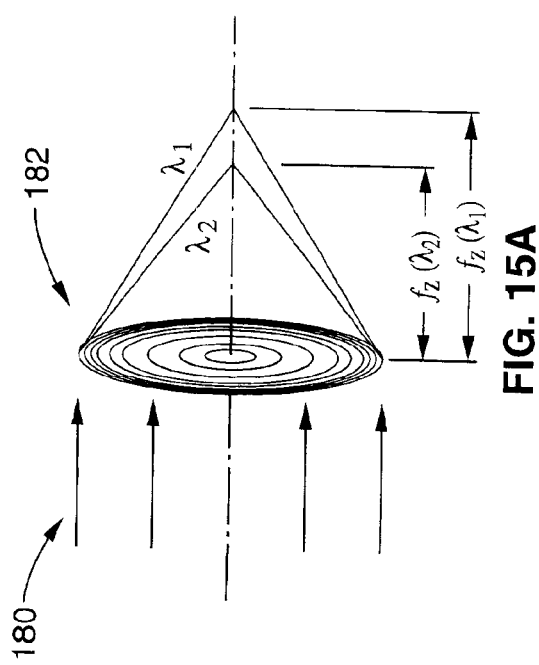

FIG. 15A through FIG. 15C illustrate a spectrometer that uses a principle similar to that of the AFO. When a plane wave 180 with wavelengths $\lambda_1$ and $\lambda_2$ passes a simple zone plate 182 as shown in FIG. 15A, they will be focused and dispersed. Suppose that for $\lambda_1 < \lambda_2$ the focal length of the zone plate will vary as $f_z(\lambda_1) > f_z(\lambda_2)$. When the same radiation passes through a concave refractive lens 184, its focal length will vary in the same way as shown in FIG. 15B. When the zone plate is combined with the concave refractive lens as shown in FIG. 15C, the dispersive effect of the two lenses are combined, resulting in an highly effective spectrometer with high spatial resolution.

In general, the AFO of the present invention has two important benefits. First, it allows very large zone plates (usually consisting of a larger number of zones) to be used without suffering from chromatic aberrations. The large size optic provides a large working distance and a large imaging field. Second, it allows a large bandwidth of electromagnetic radiation from a source to be used to increase throughput. Thus, many techniques that were previously impossible or very difficult can be very easy using the present AFO. Moreover, previous techniques that required a synchrotron are now possible with laboratory-based x-ray sources.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Examples of Achromatic Fresnel Lens Parameters

| DOW (nm) | refractive lens material | diameter (mm) | imaging field mm | zone plate outer zone width (nm) | focal length (mm) | depth of field ($\mu$m) | bandwidth (%) | efficiency (%) | Rayleigh resolution (nm) |
|---|---|---|---|---|---|---|---|---|---|
| 12.57 | silicon | 10 | 5 | 95 | 76 | 2.9 | 0.3 | 10 | 115 |
| 12.57 | silicon | 6 | 3 | 70 | 33 | 1.6 | 0.4 | 10 | 85 |
| 12.57 | silicon | 6 | 3 | 41 | 20 | 0.5 | 0.25 | 10 | 50 |
| 13.38 | silicon | 10 | 5 | 95 | 71 | 2.9 | 1.2 | 40 | 115 |
| 13.38 | silicon | 6 | 3 | 70 | 31 | 1.6 | 1.2 | 40 | 85 |
| 13.38 | silicon | 6 | 3 | 41 | 18 | 0.5 | 1.2 | 40 | 50 |
| 1.34 | copper | 25 | 15 | 95 | 1773 | 27.0 | 0.1 | 10 | 115 |
| 1.34 | copper | 18 | 8 | 70 | 941 | 14.6 | 0.1 | 10 | 85 |
| 1.34 | copper | 5 | 2 | 41 | 153 | 5.0 | 0.15 | 10 | 50 |
| 1.16 | sodium | 25 | 15 | 95 | 2050 | 36.2 | 0.3 | 40 | 115 |
| 1.16 | sodium | 18 | 8 | 70 | 1085 | 19.6 | 0.3 | 40 | 85 |
| 1.16 | sodium | 5 | 2 | 41 | 176 | 6.7 | 0.3 | 40 | 50 |

What is claimed is:

1. An EUV and x-ray achromatic lens, comprising:
a combination of a diffractive lens and a refractive Fresnel lens;
wherein said refractive lens is separated from said diffractive lens; and
wherein said diffractive lens comprises a Fresnel zone plate; and
wherein said diffractive lens and said refractive lens are formed on opposite sides of a common substrate and configured to correct chromatic aberration of the lenses.

2. A lens as recited in claim 1, wherein said diffractive lens comprises a zone plate.

3. A lens as recited in claim 1, wherein said Fresnel zone plate is selected from the group of Fresnel zone plates consisting essentially of binary zone plates, phase zone plates and blazed zone plates.

4. A lens as recited in claim 1, wherein aberrations in said achromatic lens are corrected by adjusting geometric parameters of said zone plate.

5. A lens as recited in claim 1, wherein zones are shifted to less then $2\pi$.

6. A lens as recited in claim 1, wherein zone positions are computed for specific conjugates to eliminate spherical aberration.

7. A lens as recited in claim 1, further comprising means for reducing or eliminating coma.

8. A lens as recited in claim 1, wherein at least a portion of said refractive lens has a stepped face which approximates a desired curvature.

9. A lens as recited in claim 1, further comprising a plurality of refractive lenses.

10. A lens as recited in claim 1, further comprising a plurality of diffractive lenses.

11. A lens as recited in claim 1, wherein said refractive lens has a focal length that crosses zero at a designed operating wavelength.

12. A lens as recited in claim 1, wherein said refractive lens comprises a material having an absorption edge with in the desired spectral range of the achromatic lens.

13. A lens as recited in claim 12, wherein said absorption edge comprises a K-edge or an L-edge.

14. A lens as recited in claim 12, wherein operation of said refractive lens is based on anomalous dispersion of radiation near said absorption edge.

15. An EUV and x-ray achromatic lens, comprising:
a combination of a diffractive lens and a refractive Fresnel lens;
wherein said refractive Fresnel lens is coupled to said diffractive lens;
wherein said diffractive lens comprises a Fresnel zone plate; and
wherein said diffractive lens and said refractive lens are formed on opposite sides of a common substrate and configured to correct chromatic aberration of the lenses.

16. A lens as recited in claim 15, wherein said diffractive lens and said refractive lens are formed on a common substrate.

17. A lens as recited in claim 15, wherein said diffractive lens comprises a zone plate.

18. A lens as recited in claim 17, wherein said Fresnel zone plate is selected from the group of Fresnel zone plates consisting essentially of binary zone plates, phase zone plates and blazed zone plates.

19. A lens as recited in claim 15, wherein aberrations in said achromatic lens are corrected by adjusting geometric parameters of said zone plate.

20. A lens as recited in claim 15, wherein zones are shifted to less than $2\pi$.

21. A lens as recited in claim 15, wherein zone positions are computed for specific conjugates to eliminate spherical aberration.

22. A lens as recited in claim 15, further comprising means for reducing or eliminating coma.

23. A lens as recited in claim 15, wherein at least a portion of said refractive lens has a stepped face which approximates a desired curvature.

24. A lens as recited in claim 15, further comprising a plurality of refractive lenses.

25. A lens as recited in claim 15, further comprising a plurality of diffractive lenses.

26. A lens as recited in claim 15, wherein said refractive lens has a focal length that crosses zero at a designed operating wavelength.

27. A lens as recited in claim 15, wherein said refractive lens comprises a material having an absorption edge with in the desired spectral range of the achromatic lens.

28. A lens as recited in claim 27, wherein said absorption edge comprises a K-edge or an L-edge.

29. A lens as recited in claim 27, wherein operation of said refractive lens is based on anomalous dispersion of radiation near said absorption edge.

30. An EUV and x-ray achromatic lens, comprising:
a combination of a Fresnel zone plate and a Fresnel lens;
wherein said Fresnel zone plate comprises a diffractive lens;
wherein said Fresnel lens comprises a refractive lens; and
wherein said diffractive lens and said refractive lens are formed on opposite lenses.

31. A lens as recited in claim 30, wherein said Fresnel zone plate and said Fresnel lens are formed on a common substrate.

32. A lens as recited in claim 30, wherein said zone plate is selected from the group of zone plates consisting essentially of binary zone plates, phase zone plates and blazed zone plates.

33. A lens as recited in claim 30, wherein aberrations in said achromatic lens are corrected by adjusting geometric parameters of said zone plate.

34. A lens as recited in claim 30, wherein zones are shifted to less than $2\pi$.

35. A lens as recited in claim 30, wherein zone positions are computed for specific conjugates to eliminate spherical aberration.

36. A lens as recited in claim 30, wherein said Fresnel lens comprises a refractive Fresnel lens.

37. A lens as recited in claim 30, further comprising means for reducing or eliminating coma.

38. A lens as recited in claim 30, wherein at least a portion of said Fresnel lens has a stepped face which approximates a desired curvature.

39. A lens as recited in claim 30, further comprising a plurality of Fresnel lenses.

40. A lens as recited in claim 30, further comprising a plurality of diffractive lenses.

41. A lens as recited in claim 30, wherein said Fresnel lens has a focal length that crosses zero at a designed operating wavelength.

42. A lens as recited in claim 30, wherein said Fresnel lens comprises a material having an absorption edge with in the desired spectral range of the achromatic lens.

43. A lens as recited in claim 42, wherein said absorption edge comprises a K-edge or an L-edge.

44. A lens recited in claim 42, wherein operation of said Fresnel lens is based on anomalous dispersion of radiation near said absorption edge.

* * * * *